(12) United States Patent
Verma et al.

(10) Patent No.: US 11,211,508 B2
(45) Date of Patent: Dec. 28, 2021

(54) THIN-FILM SOLAR MODULE WITH IMPROVED SHUNT RESISTANCE

(71) Applicant: (CNBM) BENGBU DESIGN & RESEARCH INSTITUTE FOR GLASS INDUSTRY CO., LTD, Bengbu (CN)

(72) Inventors: Rajneesh Verma, Au in der Hallertau (DE); Christian Schubbert, Munich (DE); Marko Stoelzel, Munich (DE)

(73) Assignee: (CNBM) BENGBU DESIGN & RESEARCH INSTITUTE FOR GLASS INDUSTRY CO., LTD, Bengbu (CN)

( * ) Notice: Subject to any disclaimer, the term of this patent is extended or adjusted under 35 U.S.C. 154(b) by 0 days.

(21) Appl. No.: 16/766,938

(22) PCT Filed: Nov. 28, 2018

(86) PCT No.: PCT/CN2018/117880
§ 371 (c)(1),
(2) Date: May 26, 2020

(87) PCT Pub. No.: WO2019/109837
PCT Pub. Date: Jun. 13, 2019

(65) Prior Publication Data
US 2021/0020799 A1 Jan. 21, 2021

(30) Foreign Application Priority Data

Dec. 4, 2017 (EP) .................................. 17205274

(51) Int. Cl.
*H01L 31/042* (2014.01)
*H02N 6/00* (2006.01)
(Continued)

(52) U.S. Cl.
CPC .. *H01L 31/0463* (2014.12); *H01L 31/035281* (2013.01); *H01L 31/02167* (2013.01);
(Continued)

(58) Field of Classification Search
CPC ....... H01L 31/035281; H01L 31/02167; H01L 31/022483; H01L 31/0463; H01L 31/0465; H01L 31/046
See application file for complete search history.

(56) References Cited

U.S. PATENT DOCUMENTS 8,669,466 B2 3/2014 Guha et al.
9,893,221 B2 2/2018 Kim et al.
(Continued)

FOREIGN PATENT DOCUMENTS

CN 102047431 A 5/2011
CN 102449778 A 5/2012
(Continued)

OTHER PUBLICATIONS

International Search Report for international Application No. PCT/CN2018/117880 filed on Nov. 28, 2018 on behalf of Bengbu Design & Research Institute for Glass Industry Co., Ltd, dated Feb. 28, 2019. 3 pages.
(Continued)

*Primary Examiner* — Angelo Trivisonno
(74) *Attorney, Agent, or Firm* — Bayramoglu Law Offices LLC (57) ABSTRACT

A thin-film solar module with a substrate and a layer structure applied thereon. The layer structure has a rear electrode layer, a front electrode layer, and an absorber layer arranged between the rear electrode layer and the front electrode layer. The absorber layer has doping of a first conductor type, while the front electrode layer has doping of a second conductor type. Serially connected solar cells are
(Continued)

formed in the layer structure by patterning zones having a first patterning trench subdividing the rear electrode layer, a second patterning trench subdividing the absorber layer, and a third patterning trench subdividing the front electrode layer.

19 Claims, 6 Drawing Sheets

(51) Int. Cl.
    *H01L 31/0463*     (2014.01)
    *H01L 31/0352*     (2006.01)
    *H01L 31/0216*     (2014.01)
    *H01L 31/0224*     (2006.01)
    *H01L 31/032*     (2006.01)
    *H01L 31/0749*     (2012.01)

(52) U.S. Cl.
    CPC .. *H01L 31/022483* (2013.01); *H01L 31/0323* (2013.01); *H01L 31/0749* (2013.01)

(56) References Cited

U.S. PATENT DOCUMENTS

| | | |
|---|---|---|
| 2009/0301543 A1 | 12/2009 | Reddy et al. |
| 2010/0236607 A1* | 9/2010 | Korevaar ............ H01L 31/0749 136/249 |
| 2017/0162725 A1 | 6/2017 | Strahm et al. |
| 2017/0373208 A1 | 12/2017 | Bosman et al. |

FOREIGN PATENT DOCUMENTS

| | | |
|---|---|---|
| CN | 102906883 A | 1/2013 |
| CN | 106663715 A | 5/2017 |
| CN | 107210324 A | 9/2017 |
| DE | 4324318 C1 | 1/1995 |
| EP | 2200097 A1 | 6/2010 |

OTHER PUBLICATIONS

Written Opinion for International Application No. PCT/CN2018/117880 filed on Nov. 28, 2018 on behalf of Bengbu Design & Research Institute for Glass Industry Co., Ltd, dated Feb. 28, 2019. 4 pages.

\* cited by examiner

THIN-FILM SOLAR MODULE WITH IMPROVED SHUNT RESISTANCE

CROSS REFERENCE TO RELATED APPLICATIONS

The present application is the U.S. national stage of International Patent Application PCT/CN2018/117880 filed internationally on Nov. 28, 2018, which, in turn, claims priority to European Patent Application No. EP17205274.8 filed on Dec. 4, 2017.

The present invention is in the technical area of photovoltaic energy generation and relates to a thin-film solar module with improved shunt resistance, as well as a method for production thereof.

Thin-film solar modules have already been described many times in the patent literature. Reference is made merely by way of example to the printed publications DE 4324318 C1 and EP 2200097 A1. Thin-film solar modules offer the particular advantage that the solar cells can already be serially connected in an integrated form during production of the layers. The various layers are typically applied directly on a carrier substrate that is provided, after patterning of the solar cells, with a cover layer, as a result of which a weathering-resistant composite is obtained. The layer structure comprises a front electrode layer, a rear electrode layer, as well as a photovoltaically active absorber layer, with additional layers usually also present.

In terms of the technological handling quality and efficiency, thin-film solar modules with an absorber layer of amorphous, micromorphous, or polycrystalline silicon, cadmium telluride (CdTe), gallium-arsenide (GaAs), or a chalcopyrite compound, in particular copper-indium/gallium-disulfide/diselenide $CuF(In,Ga)(S,Se)_2$, have proved advantageous. Due to the band gap well-adapted to the spectrum of sunlight, particularly high absorption coefficients can be achieved with compounds based on $Cu(In,Ga)(S,Se)_2$.

During production of thin-film solar modules various defects can occur, which disadvantageously cause internal electrical power losses and reduce the rated output and the efficiency of the module. The quality of a thin-film solar module can be described by the so-called "fill factor". This is a measure calculated from the quotient of the maximum power of the solar module and the product of the short circuit current and the open circuit voltage. The lower the fill factor, the lower the efficiency of the solar module, such that the highest possible fill factor is desirable.

Electrical short circuits (shunts) that result in an elevated recombination rate of charge carriers and reduce the fill factor of solar modules in an undesirable manner are a significant example of a performance-reducing defect. Shunts can have many causes. They are frequently based on production-related defects during the forming of the integrated serial connection of the solar cells, wherein, in particular, inadvertent electrical contacts between the front electrode and the rear electrode of the solar cells occur during the production of the patterning lines for the serial connection of the solar cells.

In contrast, the object of the present invention consists in advantageously improving thin-film solar modules known in the prior art as well as their production such that the efficiency of the thin-film solar module is increased. Also, it should be possible to produce the modules economically and efficiently in industrial series production, even with conventional methods.

These and other objects are accomplished according to the proposal of the invention by a thin-film solar module as well as a method for its production in accordance with the independent claims. Advantageous embodiments of the invention are indicated by the features of the dependent claims.

According to the invention, a thin-film solar module is shown that comprises a substrate with a layer structure applied thereon with a monolithically integrated serial connection of solar cells for photovoltaic energy generation.

In keeping with the customary use of the term "thin-film solar module", it refers to modules with a layer structure with a low thickness of, for example, a few microns, such that a carrier substrate is required for adequate mechanical stability. The carrier substrate can be made, for example, of inorganic glass, plastic, or metal, but also of a metal alloy, and can be designed, depending on the respective layer thickness and the specific material properties, as a rigid plate or a flexible film.

The invention refers to a thin-film solar module in substrate configuration, wherein, for producing the solar cells, the layer structure is applied on a substrate surface facing the light-incident side. The invention equally refers to a thin-film solar module in superstrate configuration, wherein the substrate is transparent and the layer structure is applied on a substrate surface facing away from the light-incident side.

In a manner known per se, the layer structure comprises a rear electrode layer, a front electrode layer, and a photovoltaically active absorber layer arranged between the rear electrode layer and the front electrode layer.

The front electrode layer is optically transparent since passage of light to the layer structure must be enabled. The transparent front electrode layer typically comprises a doped metal oxide (TCO=transparent conductive oxide), for example, n-conductive, in particular aluminum-doped, zinc oxide (AZO).

The photovoltaically active absorber layer preferably comprises a chalcopyrite compound, advantageously, a semiconductor from the group copper indium/gallium disulfide/diselenide $(Cu(In,Ga)(S,Se)_2)$. In the above formula, indium and gallium can be present either alone or in combination. The same is true for sulfur and selenium, which can be present either alone or in combination. Particularly suitable as material for the absorber layer is CIS (copper indium diselenide/disulfide) or CIGS (copper indium gallium diselenide, copper indium gallium disulfide, copper indium gallium disulfoselenide).

According to one embodiment, the absorber layer has doping of a first conductor type (charge carrier type) and the front electrode has doping of the opposite conductor type (charge carrier type). Typically, the absorber layer is p-conductive (p-doped), i.e., has an excess of defect electrons (holes), and the front electrode layer is n-conductive (n-doped) such that free electrons are present in excess. Preferably, the absorber layer includes or is made of a p-conductive chalcopyrite semiconductor. Particularly advantageously, the absorber layer includes or is made of a p-conductive semiconductor from the group copper indium/gallium disulfide/diselenide $(Cu(In,Ga)(S,Se)_2)$.

A buffer layer is typically arranged between the absorber layer and the front electrode layer. This is true in particular for absorber layers based on $Cu(In,Ga)(S,Se)_2$, with which a buffer layer is required between a p-conductive $Cu(In,Ga)(S,Se)_2$ absorber layer and an n-conductive front electrode. According to current knowledge, the buffer layer enables electronic adaptation between the absorber and the front electrode. Moreover, it offers protection against sputtering damage in a subsequent process step of deposition of the front electrode, for example, by DC magnetron sputtering.

By means of the succession of n-conductive front electrode layer, buffer layer, and p-conductive absorber layer, a p-n-heterojunction is formed, in other words a junction between layers of the opposite conductor type. The result is that a space charge zone builds up in the solar cells in each case, the electrical field of which causes the electrons of the electron-hole pairs photovoltaically produced in the absorber to drift to the front electrode and the holes to drift to the rear electrode.

In the layer structure of the thin-film solar module, the integrated serially connected solar cells are implemented conventionally by means of patterning zones. Thus, at least the rear electrode layer is subdivided by first patterning trenches, commonly referred to as "P1", into sections separated from one another, which sections form the rear electrodes of the solar cells. Each first patterning trench P1 is formed at least by opposing edges of adjacent rear electrodes, i.e. is given by the region between adjacent rear electrodes. Also, at least the absorber layer is subdivided by second patterning trenches, commonly referred to as "P2", into sections separated from one another, which sections form the absorbers of the solar cells. Each second patterning trench P2 is formed at least by opposing edges of adjacent absorbers, i.e. is given by the region between adjacent absorbers. Furthermore, at least the front electrode layer is subdivided by third patterning trenches, commonly referred to as "P3", into sections separated from one another, which sections form the front electrodes of the solar cells. Each third patterning trench P3 is formed at least by opposing edges of adjacent front electrodes, i.e. is given by the region between adjacent front electrodes.

Adjacent solar cells are electrically connected to one another in serial connection via electrically conductive material in the second patterning trenches P2, wherein the front electrode of one solar cell is electrically connected to the rear electrode of the adjacent solar cell and, typically, but not mandatorily, contacts it directly. The patterning trenches are arranged in the order P1-P2-P3, wherein by means of a direct succession of a first to a third patterning trench P1-P2-P3, a patterning zone, in the context of the present invention, is formed.

In the context of the present invention, the term "trench" refers to a material-filled elongated depression (perpendicular to the flat substrate) of the layer structure, wherein a trench is implemented in one or a plurality of layers of the layer structure. The term "patterning trench" refers to a trench that serves for patterning the integrated serially connected solar cells, wherein a patterning trench completely subdivides at least one layer into two layer sections separated from one another. Each patterning trench is delimited by two opposing trench walls, wherein at least one section of each trench wall is formed by the material of the subdivided layer. A patterning trench is filled by material that is different from the material of the at least one subdivided layer. Thus, in the thin-film solar module according to the invention, in particular, the first patterning trenches P1 for subdividing the rear electrode layer into rear electrodes of the solar cells are filled by material of the absorber layer. This can be done in a simple manner during deposition of the absorber layer.

Preferably, the patterning zones are in each case linear, in particular, rectilinear. Correspondingly, the patterning trenches are preferably linear in the form of patterning lines, in particular, rectilinear patterning lines. In the patterning zones, the first through the third patterning trenches P1-P2-P3 are preferably arranged parallel to one another and run, for example, parallel to one edge of a rectangular or square module. In particular, the patterning trenches P1-P2-P3 can in each case extend all the way to the edge of the layer structure. The direction of extension of the patterning trenches P1-P2-P3 can be defined as module width or solar cell width; the direction perpendicular thereto, as module length or solar cell length.

In keeping with the customary use, the term "solar cell" refers to a region of the layer structure that has a front electrode, an absorber, and a rear electrode and is delimited by two patterning zones directly adjacent one another, consisting in each case of the structuring trenches P1-P2-P3. This applies analogously in the edge region of the module, wherein instead of a patterning zone, there is a connection section for electrically contacting the serial connection of the solar cells such that the solar cell is defined by the layer region with a front electrode, absorber, and rear electrode, which is situated between a patterning zone and the directly adjacent connection section.

According to the present invention, within the first patterning trench P1 of at least one patterning zone, preferably of all patterning zones, at least one trench filled by material is implemented, referred to in the following for ease of reference as "insulating trench". The insulating trench is completely filled by at least one material that is different from the material of the absorber layer, referred to in the following for ease of reference as "insulating trench material". It is essential for the at least one material filling the insulating trench to have greater electrical resistance (i.e., lower electrical conductivity) for charge carriers of the first conductor type (excess charge carrier of the absorber layer) than the absorber layer itself. If the absorber layer is, for example, p-conductive, the insulating trench material has greater electrical resistance for holes than the material of the absorber layer. This requirement for the electrical conductivity of the insulating trench material also includes the case that the insulating trench material has doping opposite the material of the absorber layer. For the case of p-conductive doping of the absorber layer, the insulating trench material can have n-conductive doping, wherein the electrical conductivity for holes is always lower than that of the p-conductive absorber layer.

As the inventors realized for the first time, shunts relevant for the fill factor of the thin-film solar module can be caused not only by faults or defects in the production of the module but also by the basic structure of the integrated serial connection. This is the case, in particular, when the first patterning trenches P1 for subdividing the rear electrode layer into rear electrodes of the solar cells are filled by material of the absorber layer. Thus, for example, the p-doped chalcopyrite semiconductor frequently used as an absorber has, to be sure, a low but not disappearing electrical conductivity for holes such that a permanent electrical short circuit (shunt) is present between two directly adjacent rear electrodes, as a result of which the efficiency of the module is reduced. To avoid this problem, it would be conceivable to make the first patterning trench wide enough that the electrical shunt resistance for holes is so high that the problem is negligible. However, this approach reduces the optically active area of the module such that the efficiency of the module is disadvantageously reduced.

The invention points to a totally new approach to the solution of this problem in that at least one insulating trench is implemented within the first patterning trench P1 of at least one patterning zone, which insulating trench is filled by at least one material that has lower electrical conductivity for the excess charge carriers of the absorber layer (e.g., holes) than the absorber layer such that an electrical short circuit of holes between directly adjacent rear electrodes is inhibited or avoided. The shunt resistance of the first patterning trench P1 is increased by the insulating trench material. The optically active area of the thin-film solar module is not adversely affected by this. The fill factor and, thus, the efficiency of the thin-film solar module according to the invention can thus be advantageously increased.

At least one section of the material-filled insulating trench is formed within the first patterning trench in the absorber layer material layer situated there. Preferably, the insulating trench is linear (insulating line), in particular rectilinear, and, particularly preferably, extends parallel to the first through the third patterning trench P1-P2-P3. In particular, the insulating trench can extend all the way to the edge of the layer structure. The insulating trench preferably, but not mandatorily, extends to the bottom of the first patterning trench. Preferably, the insulating trench separates the absorber layer completely. The insulating trench constitutes a material-filled recess at least within the first patterning trench.

The at least one insulating trench of the first patterning trench at least of one patterning zone is implemented within the first patterning trench. Consequently, a dimension referred to as "width" of the insulating trench (within the first patterning trench) in the direction of the succession of the first, second, and third patterning trench of the patterning zone is smaller than a width of the first patterning trench measured in the same direction.

Preferably, the insulating trench of the first patterning trench at least of one patterning zone has a minimum width dependent on the electrical conductivity for charge carriers of the first conductor type of the insulating trench material, as a result of which a sufficient increase in the electrical resistance for the charge carriers of the first conductor type should be achieved. Preferably, the insulating trench has, for this purpose, a width such that the electrical (shunt) resistance for charge carriers of the first conductor type in the first patterning trench is at least 1.5 times, at least 2 times, in particular 1.5 times to 4 times, the electrical (shunt) resistance for charge carriers of the first conductor type in the first patterning trench without an insulating trench. Considered here is the electrical resistance between the two rear electrodes separated by the first patterning trench, i.e., over the full width of the first patterning trench. Thus, generally speaking, a satisfactory increase in the fill factor of the thin-film solar module can be achieved.

Preferably, the width of the insulating trench of the first patterning trench at least of one patterning zone is at least 10%, at least 20%, at least 30%, at least 40%, or at least 50%, but less than 100%, of the width of the first patterning trench. Thus, independently of the insulating trench material, a significant increase in the electrical (shunt) resistance for charge carriers of the first conductor type can be achieved in the first patterning trench. For example, the insulating trench has, with a width of the first patterning trench of 40 μm, a minimum width of 5 μm and the width of the insulating trench is preferably in the range from 5 μm to 30 μm.

According to one embodiment of the invention, the at least one insulating trench of the first patterning trench at least of one patterning zone is implemented completely within the first absorber layer material filling the first patterning trench. This means that the two mutually opposing trench walls of the insulating trench, between which the width of the insulating trench is measured, are formed by material of the absorber layer. Preferably, but not mandatorily, the absorption layer material situated within the first patterning trench is completely subdivided by the insulating trench into two sections separated from one another, with the insulating trench extending, in this case, to the bottom of the first patterning trench. Preferably, the insulating trench separates the absorber layer completely, i.e. the insulating trench extends through the complete absorber layer wherein opposing trench walls of the section of the insulating trench situated in the region of the absorber layer are formed by the material of the absorber layer. Preferably, the insulating trench extends through the entire absorber layer till the bottom of the first patterning trench wherein the opposing trench walls are only formed by the material of the absorber layer. Accordingly, in the region (plane) of the absorber layer, material of the absorber layer is present between the insulating trench and the second patterning trench of the same patterning zone (succession of first to third patterning trenches, P1-P3).

According to an alternative embodiment, the insulating trench of the first patterning trench at least of one patterning zone is arranged on an edge of the first patterning trench formed by a rear electrode, wherein the edge is arranged closer to the second patterning trench of the patterning zone than an opposing edge of the first patterning trench, which edge is formed by the other rear electrode. Preferably, but not mandatorily, the absorption layer material situated within the first patterning trench is completely separated from the adjacent rear electrode by the insulating trench, with the insulating trench extending all the way to the bottom of the first patterning trench. In this case, the trench walls of the insulating trench are formed by the material of the absorption layer and the rear electrode. Preferably, the insulating trench separates the absorber layer completely, i.e. the insulating trench extends through the complete absorber layer wherein opposing trench walls of the insulating trench in the region (plane) of the absorber layer are formed by the material of the absorber layer. Preferably, the insulating trench extends through the entire absorber layer till the bottom of the first patterning trench wherein one trench walls is only formed by the material of the absorber layer and the other trench wall (opposite to the former trench wall, closer to the second patterning trench of the same patterning zone) is formed by the rear electrode (i.e. edge of the rear electrode at which the insulating trench is arranged) and the material of the absorber layer. Accordingly, in the region (plane) of the absorber layer, material of the absorber layer is present between the insulating trench and the second patterning trench of the same patterning zone (succession of first to third patterning trenches, P1-P3).

In an embodiment particularly advantageous from a production technology standpoint, the center of a dimension of the insulating trench, measured in the direction of the succession of the first, second, and third patterning trench of the patterning zone, in other words, the center of the width of the insulating trench, does not match the center of a dimension of the first patterning trench, likewise measured in the direction of the succession of the first, second, and third patterning trench of the patterning zone, in other words, the center of the width of the first patterning trench. In this case, the center of the width of the insulating trench is offset in the direction of the second patterning trench of the same patterning zone and is thus situated in that half of the first patterning trench that is arranged closer to the second patterning trench of the same patterning zone than the other half of the first patterning trench. By means of this measure, inadvertent contact between the material of the insulating trench and of the rear electrode adjacent the first patterning trench, which is farther from the second patterning trench of the same patterning zone than the other rear electrode adjacent the first patterning trench, can be reliably and safely avoided. Depending on the material for the filling of the insulating trench (e.g., material of the front electrode layer), in the event of contact, a short circuit could undesirably be produced between the front and the rear electrode.

Basically, each first patterning trench is formed prior to depositing the absorber layer, wherein each insulating trench is formed after depositing the absorber layer. Accordingly, by forming the insulating trenches, material of the absorber layer is removed.

A buffer layer is typically arranged between the absorber layer and the front electrode layer. According to an advantageous embodiment, the insulating trench of the first patterning trench at least of one patterning zone is filled by material of the buffer layer. This enables particularly simple production of the material-filled insulating trenches, since filling can be done in a simple manner during deposition of the buffer layer. Because of its purpose of achieving electronic adaptation between the absorber and the front electrode, the material of the buffer layer always has lower electrical conductivity for charge carriers of the first conductor type than the absorber layer itself such that it is well-suited to prevent or at least to inhibit an electrical short circuit for charge carriers of the first charge type in the first patterning trench between the rear electrodes directly adjacent one another. By this means, a good increase in the electrical resistance for charge carriers of the first charge type can be obtained within the first patterning trenches.

Preferably, the material of the buffer layer includes one or a plurality of compounds that are selected from the group consisting of indium sulfide (InS), sodium-doped indium sulfide (InS:Na), cadmium sulfide (CdS), zinc oxosulfide (ZnOS), and intrinsic zinc oxide (i-ZnO). In particular, the buffer layer can consist of one or a plurality of these materials.

According to another embodiment of the invention, the insulating trench of the first patterning trench at least of one patterning zone, in particular of all patterning zones, is filled by a material, that has doping of the second conductor type, i.e., doping with a conductor type opposite the conductor type of the absorber layer. With a p-conductive absorber layer, the insulating trench material has n-doping. Preferably, the insulating trench is, for this purpose, filled by the material of the n-conductive front electrode layer, which is, for example, aluminum-doped zinc oxide (ZnO:Al). Also, by this measure, a good increase in the electrical (shunt) resistance for charge carriers of the first conductor type is achieved within the first patterning trench. Moreover, this offers process technology advantages since the filling of the insulating trenches can be done simultaneously with the filling of the second patterning trenches with material of the front electrode layer.

The invention further extends to a method for producing a thin-film solar module implemented as described above.

The method comprises providing a substrate and producing a layer structure on the substrate, wherein the layer structure is provided with a rear electrode layer, a front electrode layer, and an absorber layer arranged between the rear electrode layer and the front electrode layer with solar cells serially connected by patterning zones. At least one insulating trench is implemented within a first patterning trench at least of one patterning zone, in particular of all patterning zones, subdividing the rear electrode layer, and the insulating trench is filled by at least one material that has lower electrical conductivity for charge carriers of the first conductor type than the absorber layer. According to the invention, the first patterning zones are formed prior to producing the absorber layer, wherein the insulating trenches are produced after producing the absorber layer.

In the case of a thin-film solar module in substrate configuration, first, a flat substrate is provided for the production of the layer structure; and a rear electrode layer is deposited on one side of the substrate. The rear electrode layer can be deposited directly on one surface of the substrate. Alternatively, at least one additional layer can be situated between the substrate and the rear electrode layer. An absorber layer is deposited over the rear electrode layer. The rear electrode layer is situated between the substrate and the absorber layer. The absorber layer can be deposited directly onto one surface of the rear electrode layer. Alternatively, at least one additional layer can be situated between the rear electrode layer and the absorber layer. A front electrode layer is deposited over the absorber layer. The absorber layer is situated between the front electrode layer and the rear electrode layer. The front electrode layer can be deposited directly onto a surface of the absorber layer. Alternatively, at least one additional layer can be situated between the front electrode layer and the absorber layer. Typically, at least one buffer layer is situated between the absorber layer and the front electrode layer. At least the rear electrode layer is patterned (subdivided) by first patterning trenches P1. The patterning of the rear electrode layer is typically, but not mandatorily, done before depositing the absorber layer. At least the absorber layer is patterned (subdivided) by second patterning trenches P2. The patterning of the absorber layer is typically, but not mandatorily, done before depositing the front electrode layer. At least the front electrode layer is patterned (subdivided) by third patterning trenches P3.

In an advantageous embodiment of the method, the insulating trench of the at least one patterning zone is filled, at least partially, in particular, completely, by material of a buffer layer arranged between the absorber layer and the front electrode layer. In this case, the insulating trench is introduced into the material within the first patterning trench after production of the absorber layer and before deposition of the buffer layer. The filling of the insulating trenches can be integrated in a simple manner into an existing process of thin-film solar module production, wherein, advantageously, no separate step is necessary for the filling of the insulating trenches.

In another embodiment of the method, the insulating trench of the at least one patterning zone is filled, at least partially, in particular, completely, by material of the front electrode layer. In this case, the insulating trench is introduced into the material within the first patterning trench after deposition of the buffer layer. The filling of the insulating trenches can be integrated in a simple manner into an existing process of thin-film solar production, wherein, advantageously, no separate step is necessary for the filling of the insulating trenches.

In another embodiment of the method, the insulating trench is produced after deposition of the front electrode layer and is filled by a material that meets the required condition with regard to the electrical conductivity of the insulating trench material.

The creation of an insulating trench can be done, depending on the design of the method, by irradiation of the absorber layer, the buffer layer, or the front electrode layer above a first patterning trench with a pulsed laser beam. The removal of material for creating the insulating trench can be achieved, in particular, by altering one or more of the following process parameters:

laser power,
traveling speed of the laser beam relative to the irradiated surface of the layer structure or substrate,
laser repetition rate,
pulse duration,
on or off period of the laser.

In particular, the depth of the hole created in the layer structure can be varied by spatial overlapping of laser pulses such that the insulating trench can be produced precisely.

Alternatively, the insulating trench can be produced by mechanical material removal, for example, by needle writing, brushing, or scraping.

The various embodiments of the invention can be realized individually or in any combinations. In particular, the features mentioned above and hereinafter can be used not only in the combinations indicated but also in other combinations or in isolation without departing from the scope of the present invention.

The invention is now explained in detail using exemplary embodiments, referring to the accompanying figures. They depict, in simplified, not to scale representation.

DETAILED DESCRIPTION OF THE DRAWINGS

Figure 1:
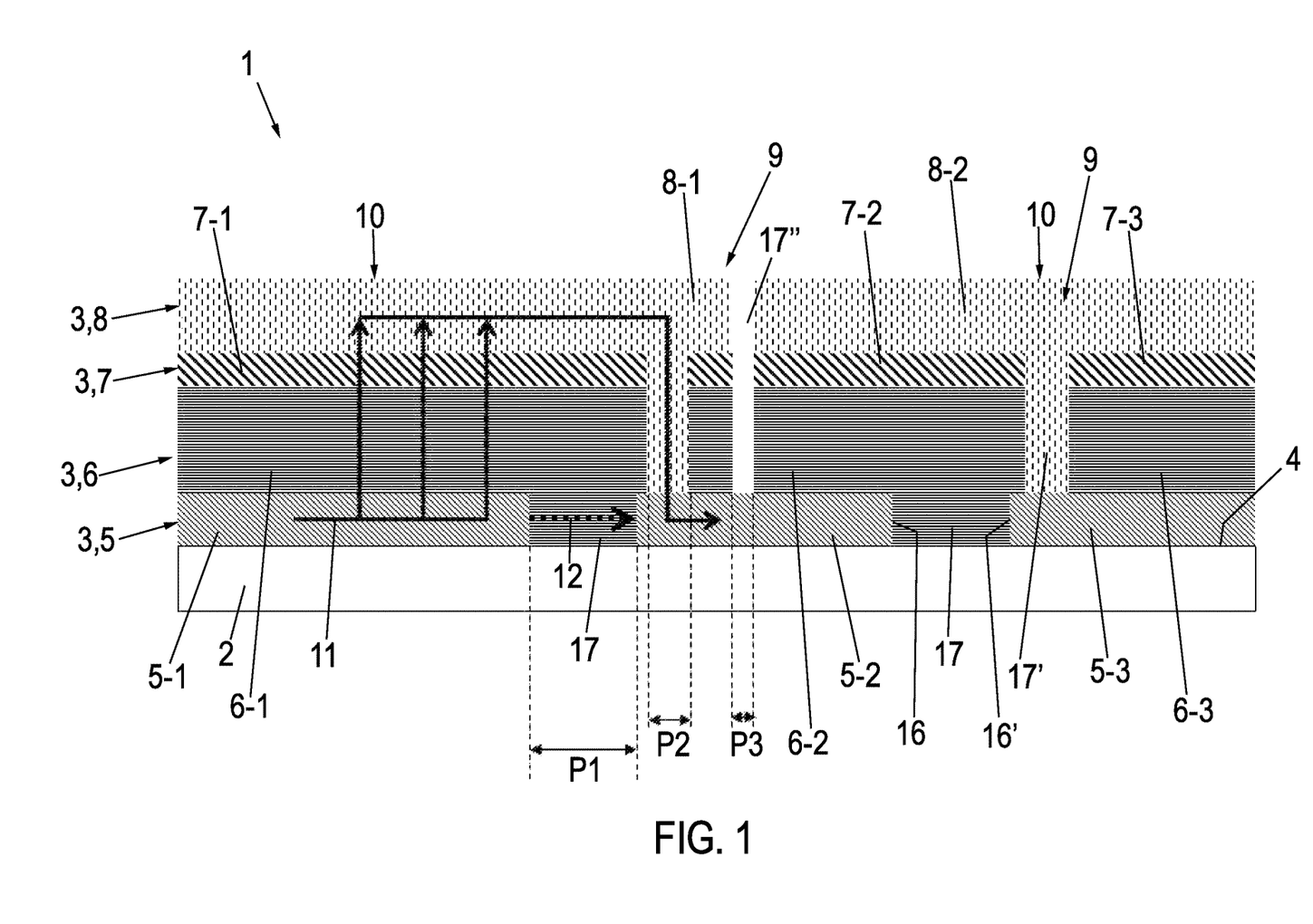
FIG. 1 a schematic representation of the integrated serial connection of solar cells of a prior art thin-film solar module in cross-section.

FIG. 1 schematically illustrates a prior art thin-film solar module referenced as a whole with the number 1 in a cross-sectional view. The thin-film solar module 1 comprises a plurality of solar cells 10 serially connected one to another in integrated form, wherein in a greatly simplified manner only two solar cells 10 are depicted. Of course, generally speaking, in the thin-film solar module 1, a large number of solar cells 10 (for example, approx. 100-150) are serially connected.

The thin-film solar module 1 has here, for example, a substrate configuration, in other words, it has a substrate 2 with a layer structure made of thin films applied thereon 3, wherein the layer structure 3 is arranged on a light-entry-side substrate surface 4 of the substrate 2. The substrate 2 is implemented, for example, as a rigid glass plate, whereas other electrically insulating materials with desired stability and inert behavior relative to the process steps performed can equally be used.

The layer structure 3 includes, arranged on the substrate surface 4, an opaque rear electrode layer 5, which is made, for example, from a light-impermeable metal such as molybdenum (Mo) and was applied on the substrate 2 by vapor deposition or magnetron-enhanced cathodic sputtering (sputtering). The rear electrode layer 5 has, for example, a layer thickness in the range from 300 nm to 600 nm.

A photovoltaically active absorber layer 6 that is made of a semiconductor doped with metal ions whose band gap is capable of absorbing the greatest possible share of sunlight is applied on the rear electrode layer 5. The absorber layer 6 is made here, for example, of a p-conductive chalcopyrite compound semiconductor, for example, a compound of the group $Cu(In,Ga)(S,Se)_2$, in particular sodium (Na)-doped $Cu(In,Ga)(S,Se)_2$. In the above formula, indium (In) and gallium (Ga) can be present alternatively or in combination. The same is true for sulfur (S) and selenium (Se), which can be present alternatively or in combination.

The absorber layer 6 has a layer thickness that is, for example, in the range from 1 to 5 μm and is, in particular, approx. 2 μm. For the production of the absorber layer 6, various material layers are applied, for example, by sputtering, which layers are subsequently thermally converted to form the compound semiconductor by heating in a furnace (RTP=rapid thermal processing), typically, in an atmosphere containing S- and/or Se. This manner of production of a compound semiconductor is well known to the person skilled in the art such that it need not be discussed in detail here.

Deposited on the absorber layer 6 is a buffer layer 7, which consists here, for example, of a single layer of sodium-doped indium sulfide ($In_2S_3$:Na) and a single layer of (non-doped) intrinsic zinc oxide (i-ZnO), not depicted in detail in FIG. 1.

A front electrode layer 8 is applied on the buffer layer 7, for example, by sputtering. The front electrode layer 8 is transparent to radiation in the visible spectral range ("window electrode") such that the incoming sunlight is weakened only slightly. The front electrode layer 8 is based, for example, on a doped metal oxide, for example, n-conductive aluminum (Al)-doped zinc oxide (ZnO). Such a front electrode layer 8 is generally referred to as a TCO layer (TCO=transparent conductive oxide). The layer thickness of the front electrode layer 8 is, for example, approx. 500 nm. The front electrode layer 8, the buffer layer 7, and the absorber layer 6 together form a heterojunction (p-n junction). The buffer layer 7 effects an electronic adaptation between the absorber layer 6 and the front electrode layer 8.

The layer structure 3 has various patterning trenches, by means of which the serially connected solar cells 10 are formed. The patterning can be done using suitable patterning technology, for example, laser lithography and/or mechanical removal. Thus, the rear electrode layer 5 is subdivided by first patterning trenches P1 into rear electrode layer sections separated from one another, which sections form the rear electrodes 5-1, 5-2, 5-3 of the solar cells 10. The absorber layer 6 is subdivided by second patterning trenches P2 into absorber layer sections separated from one another, which sections form in each case the photovoltaically active regions or absorbers 6-1, 6-2, 6-3 of the solar cells 10. The second patterning trenches P2 also subdivide the buffer layer 7 into buffer layer sections separated from one another, which sections form the buffers 7-1, 7-2, 7-3 of the solar cells 10. The front electrode layer 8 is subdivided by third patterning trenches P3 into front electrode layer sections, which form in each case the front electrodes 8-1, 8-2 of the solar cells 10. The third patterning trenches P3 extend here, for example, all the way to the rear electrode layer 5. Each direct succession of first, second, and third patterning trench P1-P2-P3 forms a patterning zone 9. A single solar cell 10 is defined by two adjacent patterning zones 9.

Perpendicular to the planar substrate 2, the second patterning trench P2 is not (partially) aligned with the first patterning trench P1 of the same patterning zone 9 so that both
(i) material of the absorber layer 6 is situated between a region of the absorber layer flush with the first patterning trench P1 (as seen perpendicular to the planar substrate 2) and the second patterning trench P2 and
(ii) material of the rear electrode 5-2 is situated between a region of the first patterning trench P1 and a region of the rear electrode 5-2 flush with the second patterning trench P2 (as seen perpendicular to the planar substrate 2).

The first patterning trench P1 is a delimited by the patterning trench walls 16, 16' formed by the adjacent rear electrodes 5-1, 5-2, with the region between the two patterning trench walls 16, 16' filled by a patterning trench material 17 of the absorber layer 6. The patterning trench material 17 is a substrate-side section of the absorber layer 6. The second patterning trench P2 is filled by a patterning material 17' of the front electrode layer 8 such that the front electrode 8-1 of a solar cell 10 is electrically conductively connected to the rear electrode 5-2 of the adjacent solar cell 10, with the front electrode 8-1 directly contacting the rear electrode 5-2 through the patterning trench material 17'. The patterning trench material 17' is a substrate-side section of the front electrode layer 8. By this means, the solar cells 10 are serially connected in an integrated form. The third patterning trench P3 is filled by a patterning trench material 17" of an adhesive layer, which serves to connect the coated substrate 2 to a cover layer (e.g., glass plate) for protection against environmental influences. This is not depicted in FIG. 1 and is without relevance for the understanding of the invention.

Upon solar irradiation, electron-hole pairs are generated in the photovoltaically active absorbers 6-1, 6-2, 6-3 of the solar cells 10. In the p-conductive absorber layer 6 and the n-conductive front electrode layer 8, a space charge zone forms, whose electrical field causes the photovoltaically generated electrons to drift to the front electrodes 8-1, 8-2 and the holes to drift to the rear electrodes 5-1, 5-2, 5-3. A resulting current path 11 is illustrated schematically in FIG. 1.

The patterning material 17 of the absorber layer 6 situated in the first patterning trench P1 forms a short-circuit path (shunt path) 12 for the holes drifting to the rear electrodes 5-1, 5-2, 5-3. The reason for this is the non-negligible electrical conductivity for holes of the patterning material 17 in the first patterning trench P1. The short-circuit path 12 is illustrated schematically in FIG. 1 by a dashed arrow. The holes drifting to the rear electrode 5-1 can be conducted to the adjacent rear electrode 5-2 via the short-circuit path 12. As the inventors realized, the fill factor of the thin-film solar module 1 is disadvantageously reduced by this permanent short-circuit path 12.

Figure 2:
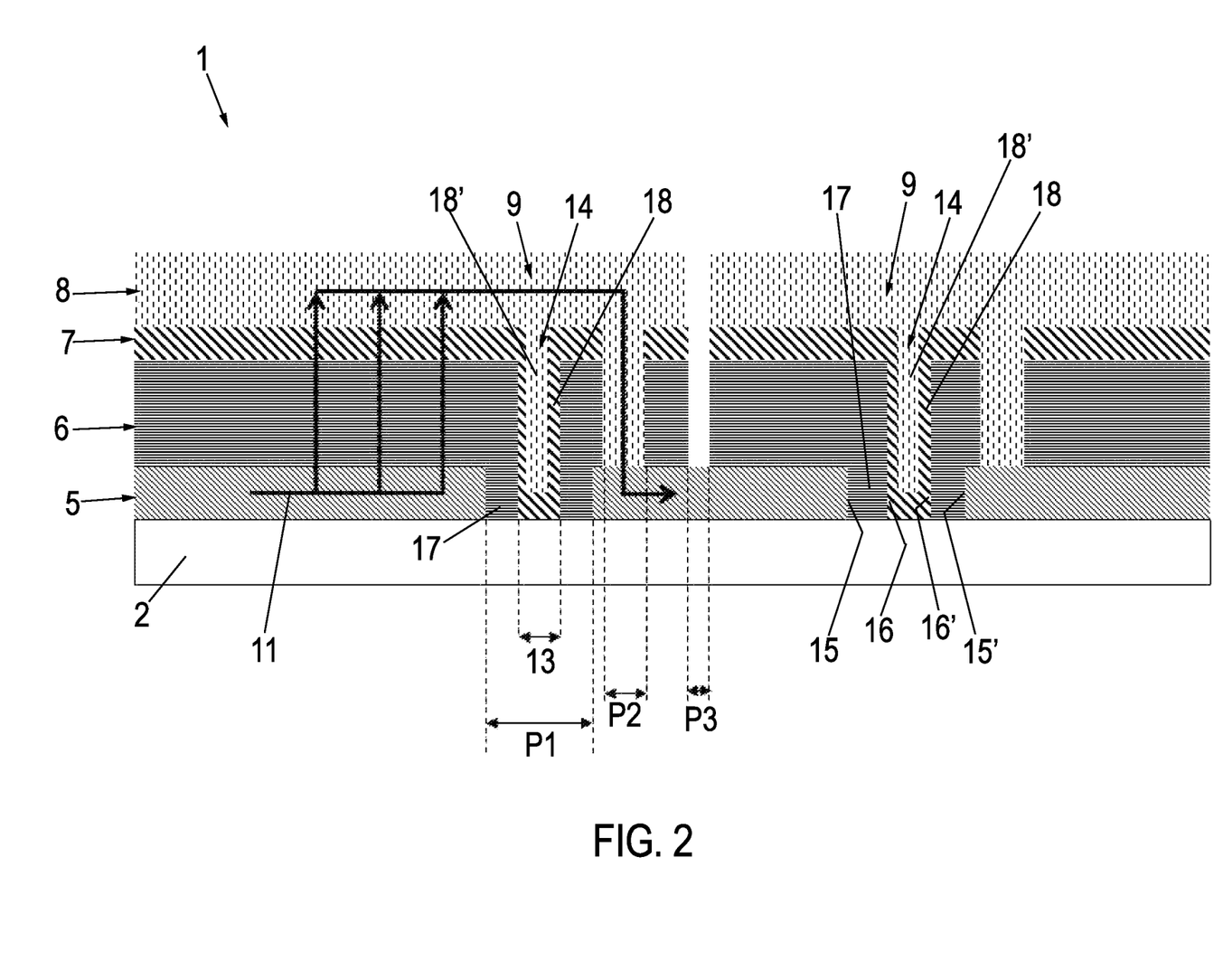
FIG. 2 a schematic representation of the integrated serial connection of solar cells according to an embodiment of the thin-film solar module according to the invention in cross-section.

Reference is now made to FIG. 2, wherein an embodiment of the thin-film solar module according to the invention 1 is illustrated. In order to avoid unnecessary repetitions, only the differences relative to FIG. 1 are explained and, otherwise, reference is made to the statements there. Accordingly, an insulating trench 13 filled by material is formed in the layer structure 3 in the region of the first patterning trench P1. The insulating trench 13 is formed in the complete absorber layer 6 and in the patterning trench material 17 of the first patterning trench P1, with the insulating trench 13 extending through the complete absorber layer 6 to the bottom of the first patterning trench P1.

The insulating trench 13 has opposing insulating trench walls 16, 16', which are only formed by the material of the absorber layer 6 over the entire extension of the insulating trench 13.

The insulating trench 13 was produced after production of the absorber layer 6 and before deposition of the buffer layer 7. The insulating trench 13 extends through the complete absorber layer 6 till the bottom of the first patterning trench P1, i.e. till the surface of the substrate 2 adjacent the rear electrode layer 5. Over the complete extension of the insulating trench 13, the insulating trench walls 16, 16' are only formed by material of the absorber layer 6 (i.e. in the section of the insulating trench 13 within the first patterning trench P1 and in the section of the insulating trench 13 within the absorber layer 6).

With the deposition of the buffer layer 7, the insulating trench 13 was partially filled by insulating trench material 18 of the buffer layer 7, wherein for process-related reasons a residual trench 14 remained, which was filled during deposition of the front electrode layer 8 with insulating trench material 18' of the front electrode layer 8. As depicted in FIG. 2, the insulating trench 13 is, after deposition of the front electrode layer 8, completely filled by insulating trench material 18 of the buffer layer 7 and insulating trench material 18' of the front electrode layer 8.

The insulating trench 13 has a central position within the first patterning trench P1, wherein the measurable width of the insulating trench 13 between the insulating trench walls 16, 16' corresponds roughly to one third of the measurable width of the first patterning trench P1 between the patterning trench walls 15, 15'.

The insulating trench 13 is partially filled by material of the buffer layer 7 and partially filled by material of the n-conductive front electrode layer 8. Both the material of the buffer layer 7 and the material of the front electrode layer 8 have a relatively high electrical resistance for holes. As a result, an electrical short-circuiting of holes between between the adjacent rear electrodes 5-1, 5-2 of the first patterning trench P1 corresponding to the short-circuit path 12 schematically depicted in FIG. 1 can be inhibited very well, improving the fill factor and, thus, the efficiency of the thin-film solar module 1.

In FIG. 2, the insulating trench 13 has a central position within the first patterning trench P1, wherein it can be advantageous to offset the insulating trench 13 in the direction of the second patterning trench P2 such that the center of the insulating trench 13 is situated within the half of the first patterning trench P1 closer to the second patterning trench P2. It would be conceivable to offset the insulating trench 13 so far in this direction that the rear electrode 5-2 forms the insulating trench wall 16' (see FIG. 4). This embodiment can have advantages in terms of process technology, particularly when the insulating trench 13 is relatively wide since contact of the insulating trench material 18 with the opposite rear electrode 5-1 is reliably and safely prevented.

Figure 3:
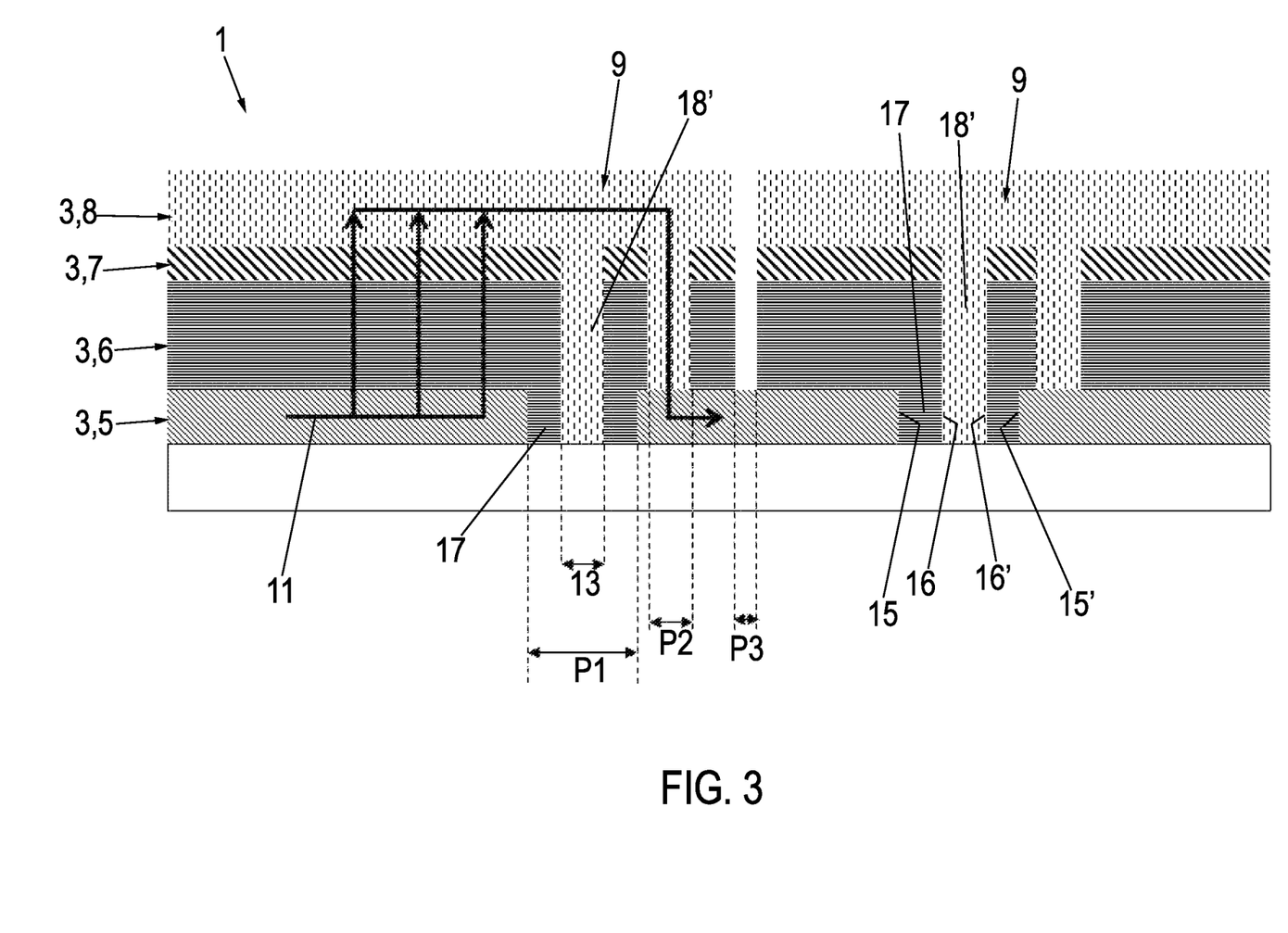
FIG. 3 a variant of the thin-film solar module of FIG. 2 in cross-section.

FIG. 3 illustrates another embodiment of the thin-film solar module 1 according to the invention. Here again, only the differences relative to FIGS. 1 and 2 are described and, otherwise, reference is made to the statements there.

In this embodiment, the insulating trench 13 was produced after deposition of the buffer layer 7 and completely filled by insulating trench material 18' of the front electrode layer 8. The insulating trench is implemented in the buffer layer 7, the absorber layer 6, and in the patterning trench material 17 of the first patterning trench P1, with the insulating trench 13 extending all the way to the bottom of the first patterning trench P1. The insulating trench 13 has opposing insulating trench walls 16, 16', which are formed by material of the buffer layer 7 and material of the absorber layer 6.

Also, by means of the insulating trench 13 filled by insulating trench material 18', electrical short-circuiting of holes between the adjacent rear electrodes 5-1, 5-2 of the first patterning trench P1 corresponding to the short-circuit path 12 schematically depicted in FIG. 1 can be inhibited very well, increasing the fill factor and, thus, the efficiency of the thin-film solar module 1.

Figure 4:
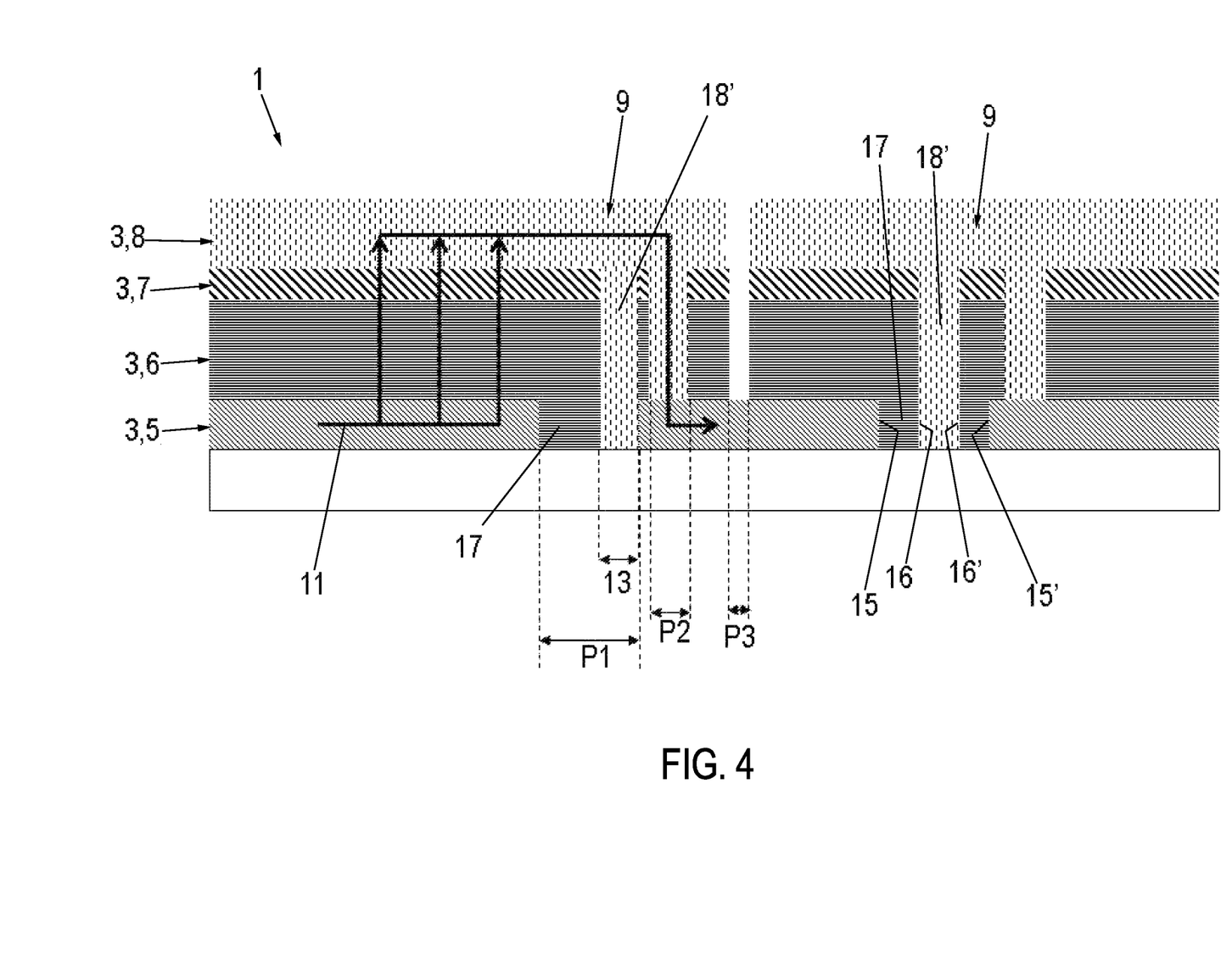
FIG. 4 a further variant of the thin-film solar module of FIG. 2 in cross-section.

FIG. 4 illustrates another embodiment of the thin-film solar module 1 according to the invention. Here again, only the differences relative to FIG. 3 are described and, otherwise, reference is made to the statements there.

In this embodiment, the insulating trench 13 was produced extending through the complete absorber layer 6 to the bottom of the first patterning trench P1. The insulating trench 13 is situated adjacent the rear electrode 5-2 and has opposing insulating trench walls 16, 16'. Accordingly, a section of the insulating trench wall 16' is identical to the trench wall 15'. One trench wall 16, which is further away from the second patterning trench P2, is only formed by material of the absorber layer 6. The other insulating trench wall 16', which is closer to the second patterning trench P2, is formed by the rear electrode 5-2 and material of the absorber layer 6. Accordingly, in the plane (level) of the absorber layer 6, material of the absorber layer 6 is situated between the insulating trench 13 and the second patterning trench P2.

Also, by means of the insulating trench 13 filled by insulating trench material 18', electrical short-circuiting of holes between the adjacent rear electrodes 5-1, 5-2 of the first patterning trench P1 corresponding to the short-circuit path 12 schematically depicted in FIG. 1 can be inhibited very well, increasing the fill factor and, thus, the efficiency of the thin-film solar module 1.

Figure 5:
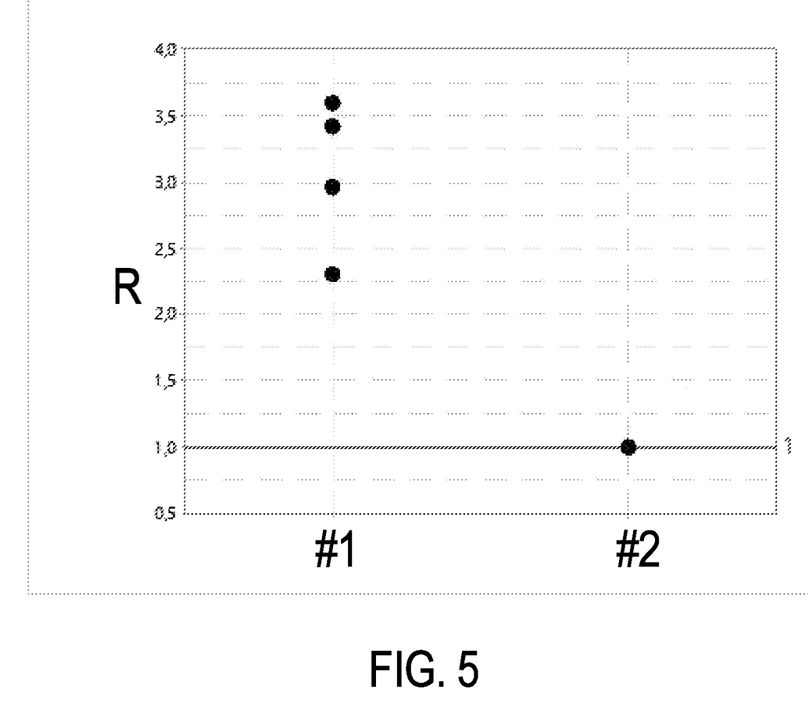
FIG. 5 a measurement diagram, in which the normalized shunt resistance of thin-film solar modules according to the invention in accordance with the embodiment of FIG. 2 is depicted.

FIG. 5 depicts a measurement diagram, in which is plotted the normalized electrical shunt resistance (R) of thin-film solar modules according to the invention (#1), which were provided, in accordance with FIG. 2, with insulating trenches 13 filled by insulating trench material 18 of the buffer layer 7 and insulating trench material 18' of the front electrode layer 8, and for a comparable reference module (#2) without insulating trenches. The normalization of the measured values was done based on the shunt resistance for the reference module (#2). Accordingly, it was possible, by means of the insulating trenches 13 within the first patterning trenches P1, to achieve a relative increase in the shunt resistance (R) at least by a factor of 2.25. The measured values for the shunt resistance of the thin-film solar module were within a range of 2.25 times to 3.6 times the comparative value for the reference module.

Figure 6:
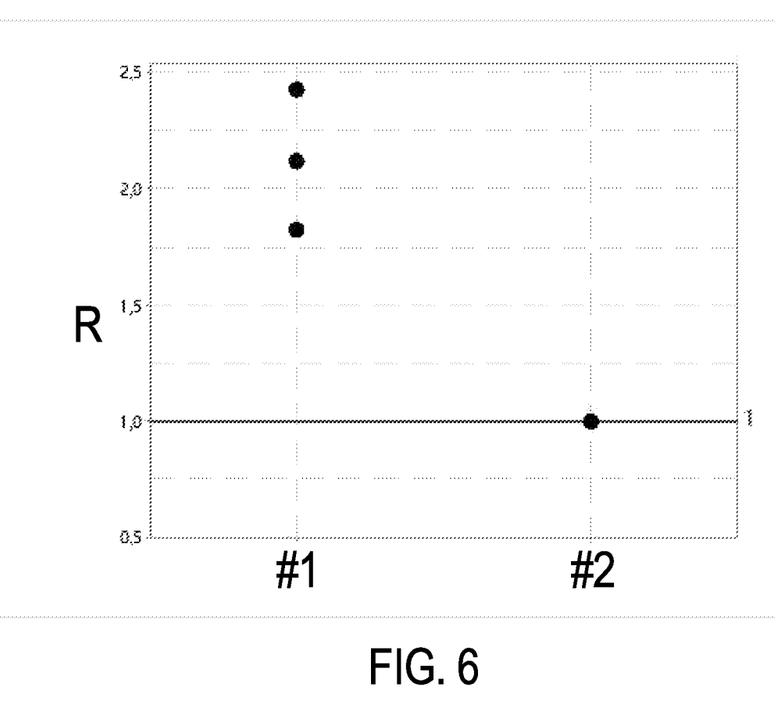
FIG. 6 a diagram, in which the normalized shunt resistance of thin-film solar modules according to the invention in accordance with the embodiment of FIG. 3 is depicted.

FIG. 6 depicts another measurement diagram, in which is plotted the normalized electrical shunt resistance (R) of thin-film solar modules according to the invention (#1), which were provided, in accordance with FIG. 3, with insulating trenches 13 filled by insulating trench material 18' of the front electrode layer 8, and for a comparable reference module (#2) without insulating trenches. The normalization of the measured values was done based on the shunt resistance for the reference module (#2). Accordingly, it was possible, by means of the insulating trenches 13 within the first patterning trenches P1, to achieve a relative increase in the shunt resistance (R) at least by a factor of 1.75. The measured values for the shunt resistance of the thin-film solar module according to the invention were within a range of 1.75 times to 2.5 times the comparative value for the reference module.

The invention makes available a thin-film solar module with which, advantageously, a reduction in electrical conductivity or an increase in electrical resistance (shunt resistance) for the excess charge carriers of the absorption layer is achieved by means of insulating trenches within the first patterning trenches filled by material of the absorption layer. Due to the increased shunt resistance and a shunt current reduced thereby, the fill factor and, thus, the efficiency of the thin-film solar module can be improved significantly. As is evident from the above description, the production of the insulating trenches in a simple and economical manner can be integrated into the production process of conventional thin-film solar modules.

LIST OF REFERENCE SIGNS 1 thin-film solar module
2 substrate
3 layer structure
4 substrate surface
5 rear electrode layer
5-1, 5-2, 5-3 rear electrode
6 absorber layer
6-1, 6-2, 6-3 absorber
7 buffer layer
7-1, 7-2, 7-3 buffer
8 front electrode layer
8-1, 8-2 front electrode
9 patterning zone
10 solar cell
11 current path
12 short-circuit path (shunt path)
13 insulating trench
14 residual trench
15, 15' patterning trench wall
16, 16' insulating trench wall
17, 17', 17" patterning trench material
18, 18' insulating trench material

What is claimed is:

1. A thin-film solar module, comprising:
a substrate; and
a layer structure applied on the substrate, the layer structure comprising a rear electrode layer, a front electrode layer, and an absorber layer arranged between the rear electrode layer and the front electrode layer,
wherein
i) the absorber layer has doping of a first conductor type and the front electrode layer has doping of a second conductor type,
ii) serially connected solar cells are formed in the layer structure by patterning zones,
iii) at least one patterning zone has:
a first patterning trench subdividing at least the rear electrode layer,
a second patterning trench subdividing at least the absorber layer,
a third patterning trench subdividing at least the front electrode layer, the first patterning trench being filled by material of the absorber layer, and
iv) at least one insulating trench is implemented within the first patterning trench, the at least one insulating trench being filled by at least one material that has lower electrical conductivity for charge carriers of the first conductor type than the absorber layer.

2. The thin-film solar module according to claim 1, further comprising a buffer layer arranged between the absorber layer and the front electrode layer, wherein the insulating trench is at least partially filled by material of the buffer layer.

3. The thin-film solar module according to claim 2, wherein the material of the buffer layer has one or a plurality of compounds, selected from the group consisting of indium sulfide (InS), sodium-doped indium sulfide (InS:Na), cadmium sulfide (CdS), zinc oxosulfide (ZnOS), and intrinsic zinc oxide (i-ZnO).

4. The thin-film solar module according to claim 1, wherein the insulating trench is at least partially filled by a material that has doping from the second conductor type.

5. The thin-film solar module according to claim 4, wherein the insulating trench is filled by material of the front electrode layer.

6. The thin-film solar module according to claim 5, wherein the material of the front electrode layer is aluminum-doped zinc oxide (ZnO:Al).

7. The thin-film solar module according to claim 1, wherein the insulating trench is implemented within the material of the absorber layer filling the first patterning trench, wherein opposing trench walls of the insulating trench are formed at least within the first patterning trench only by material of the absorber layer.

8. The thin-film solar module according to claim 1, wherein the insulating trench is arranged at an edge of the first patterning trench, the edge being arranged closer to the second patterning trench of the patterning zone than an opposite edge of the first patterning trench.

9. The thin-film solar module according to claim 1, wherein a center of a dimension of the insulating trench, measured in a direction of succession of the first, second, and third patterning trench of the patterning zone relative to a center of a dimension of the first patterning trench, measured in a direction of the succession of the first, second, and third patterning trench of the patterning zone, is offset in a direction of the second patterning trench.

10. The thin-film solar module according to claim 1, wherein the insulating trench completely subdivides the material of the absorber layer within the first patterning trench or completely separates the material of the absorber layer from the edge of the first patterning zone.

11. The thin-film solar module according to claim 1, wherein the insulating trench has a width to be measured in a direction of succession of the first, second, and third patterning trench such that electrical resistance for charge carriers of the first conductor type in the first patterning trench is at least 1.5 times the electrical resistance for charge carriers of the first conductor type in the patterning trench without an insulating trench.

12. The thin-film solar module according to claim 11, wherein the first patterning trench is at least two times the electrical resistance for charge carriers of the first conductor type.

13. The thin-film solar module according to claim 11, wherein the first patterning trench is 1.5 times to four times the electrical resistance for charge carriers of the first conductor type.

14. The thin-film solar module according to claim 1, wherein the insulating trench has a width to be measured in a direction of succession of the first, second and third patterning trench that is at least 10% of the width of the first patterning trench.

15. The thin-film solar module according to claim 1, wherein the insulating trench has a width to be measured in a direction of succession of the first, second and third patterning trench that is at least 20% of the width of the first patterning trench.

16. A method for producing the thin-film solar module according to claim 1, the method comprising:
providing a substrate; and
forming a layer structure having a rear electrode layer, a front electrode layer, and an absorber layer arranged between the rear electrode layer and the front electrode layer with solar cells serially connected by patterning zones on the substrate,
wherein
the absorber layer has doping of a first conductor type and the front electrode layer has doping of a second conductor type, the patterning zones each have first patterning trenches for subdividing the rear electrode layer, the first patterning trenches being filled by material of the absorber layer,
at least one insulating trench is implemented within a first patterning trench subdividing the rear electrode layer of at least one patterning zone, and
the insulating trench is filled by a material that has lower electrical conductivity for charge carriers of the first conductor type than the absorber layer.

17. The method according to claim 16, wherein the insulating trench is filled by material of a buffer layer arranged between the absorber layer and the front electrode layer.

18. The method according to claim 16, wherein the insulating trench is filled by material of the front electrode layer.

19. The method according to claim 16, wherein the insulating trench is produced and filled after deposition of the front electrode layer.

* * * * *